United States Patent [19]

Maggioni et al.

[11] Patent Number: 4,962,346
[45] Date of Patent: Oct. 9, 1990

[54] TRANSITORY CURRENT RECIRCULATION THROUGH A POWER SWITCHING TRANSISTOR DRIVING AN INDUCTIVE LOAD

[75] Inventors: Giampietro Maggioni, Cornaredo; Fabio Marchio', Gallarate; Marco Morelli, Livorno; Francesco Tricoli, Milan, all of Italy

[73] Assignee: SGS-Thomson Microelectronics, S.p.A., Italy

[21] Appl. No.: 180,501

[22] Filed: Apr. 12, 1988

[30] Foreign Application Priority Data

Apr. 14, 1987 [IT] Italy .................. 83618 A/87
Jun. 30, 1987 [IT] Italy .................. 83639 A/87

[51] Int. Cl.⁵ .................. H03K 3/26; H03K 17/60; G05F 1/40
[52] U.S. Cl. .................. 307/270; 307/253; 307/255; 307/315; 323/289
[58] Field of Search .............. 307/253, 270, 315, 255; 323/289

[56] References Cited

U.S. PATENT DOCUMENTS

| | | | |
|---|---|---|---|
| 3,435,295 | 3/1969 | Ladd, Jr. et al. | 307/315 |
| 3,676,713 | 7/1972 | Wiedmann | 307/300 |
| 3,978,350 | 8/1976 | Fletcher et al. | 307/300 |
| 4,013,903 | 3/1977 | Sakamoto et al. | 307/300 |
| 4,035,670 | 7/1977 | Roman | 307/300 |
| 4,055,794 | 10/1977 | Ickes et al. | 307/300 |
| 4,287,436 | 9/1981 | Tezuka et al. | 307/270 |
| 4,318,011 | 3/1982 | Zeis | 307/300 |
| 4,549,095 | 10/1985 | Stefani et al. | 307/254 |
| 4,639,823 | 1/1987 | Kuroki | 307/253 |

FOREIGN PATENT DOCUMENTS 2423258 2/1976 Fed. Rep. of Germany .
2638178 3/1978 Fed. Rep. of Germany .

OTHER PUBLICATIONS

Horowitz et al., "The Art of Electronics", Cambridge University Press 1980, p. 78.
Japanese Abstract 59-5747, vol. 8, No. 84 (E-239) 1521, Apr. 18, 1984.

Primary Examiner—Stanley D. Miller
Assistant Examiner—Trong Quang Phan
Attorney, Agent, or Firm—Pollock, Vande Sande & Priddy

[57] ABSTRACT

A circuit for recirculating an inductive load's (L) discharge current through the driving power switching transistor (Tpw) utilizes a control transistor (Tc) of opposite polarity to that of the power transistor and capable of withstanding a minimum fraction $(1/\beta)$ of the discharge current. The circuit has the advantage of allowing recirculation of current with a fixed overvoltage independent of the value of the supply voltage, without requiring additional power devices. The circuit may also be provided with means (D1, D2 and DZ1) to turn-on the control transistor in the presence of concomitant supply overvoltages to protect the power device from dumping effects.

2 Claims, 1 Drawing Sheet

TRANSITORY CURRENT RECIRCULATION THROUGH A POWER SWITCHING TRANSISTOR DRIVING AN INDUCTIVE LOAD

BACKGROUND OF THE INVENTION

1. Field of the Invention

The present invention relates to electronic circuits for driving inductive loads utilizing semiconductor power devices to drive the load and, more particularly circuits of this type monolithically integrated.

2. Description of the Prior Art

It is known that the driving of highly reactive loads presents transitory related problems. For instance, when a current through a grounded inductive load is suddenly interrupted, a negative overvoltage is generated across the load, caused by the discharge of the energy stored by the inductance during a charging phase (at the start of the current flow through the inductive load). Such a peak of negative voltage, if unchecked in terms of intensity, may cause the breakdown of junctions and, in case of monolithically integrated circuits, may cause the triggering of other transistors and of related problems. In this situation, the necessary intervention is that of providing means for discharging the energy stored in the inductance while limiting the negative overvoltage to an absolute value lower or equal to one VBE (Base-Emitter voltage).

According to known practices, there are substantially two types of circuits used for this purpose.

A first solution contemplates connecting a recirculation diode across the inductive load to provide a recirculation path to the current for discharging the stored energy.

Another solution contemplates recirculating the discharge current of the energy stored in the inductive load through the same power switching transistor, by connecting a control Zener diode between the base and the collector of the power transistor;

The first solution has the disadvantage of requiring at least an additional power device, i.e. the recirculation diode, having the capacity to withstand the passage of the peak discharge current.

The second solution, although using advantageously the same driving power transistor for recirculating the discharge current, requires the control Zener diode to be designed case by case in function of the supply voltage of the circuit in order not to interfere during the charging phase of the inductance.

SUMMARY OF THE INVENTION

The present invention proposes a new and advantageous circuit which, differently from the circuits of the prior art, does not require the use of an additional power device for functionally recirculating the discharge current while being at the same time substantially adapted to whatever supply voltage is utilized by the circuit.

According to an aspect of the present invention, it is further possible to insure that the recirculation of the discharge current of the energy stored in an inductive load takes place below a predetermined maximum voltage also in the presence of a concomitant anomalous increase of the supply voltage of the circuit caused by "dumping" effects.

BRIEF DESCRIPTION OF THE DRAWINGS

The invention and the advantages thereof will be more easily understood through reference to the annexed drawing, wherein.

DESCRIPTION OF THE PREFERRED EMBODIMENTS

In all figures the inductive load is indicated with L, the power switching transistor is indicated with Tpw and the drive circuit is shown by the elements drawn inside the dash line block indicated with 1.

Figure 1:
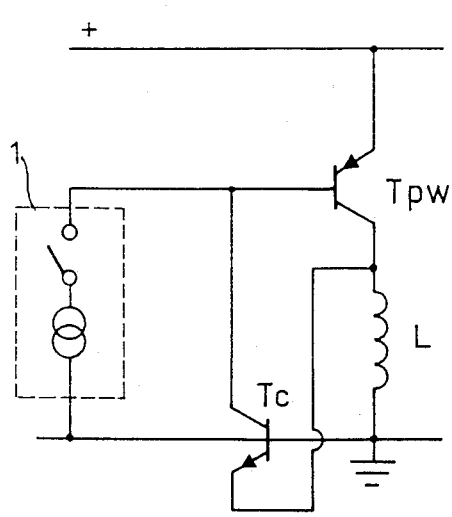
FIG. 1 is a diagram of the circuit of the invention.

The circuit of the invention, shown in FIG. 1, contemplates the use of a control transistor Tc (NPN) of opposite polarity in respect to that of the power transistor Tpw (PNP). The emitter of the control transistor Tc is connected in common to the collector of the power transistor Tpw, the collector of the control transistor Tc is connected to the base of the power transistor and the base of the control transistor is connected to the ground node of the circuit.

Figure 2:
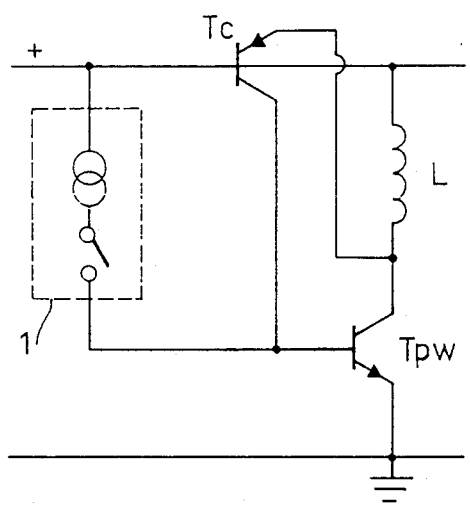
FIG. 2 shows the circuit of the invention made with devices of opposite polarity in respect to those utilized in the circuit of FIG. 1.

Substantial analogous is the circuit depicted in FIG. 2 made with devices of opposite polarity, i.e. an NPN power transistor Tpw and a PNP control transistor Tc. Essentially, the circuits of FIG. 1 and of FIG. 2 operate as follows.

When the drive signal to the power switching transistor Tpw is interrupted, a negative (FIG. 1) or a positive (FIG. 2) overvoltage develops across the inductance L. When this voltage reaches a value corresponding to the value of one VBE, the control transistor Tc turns-on and drives to conduction the power transistor Tpw. The control transistor Tc withstands a minimum fraction of the discharge current of the energy stored in the inductance L (i.e. a fraction equal to $1/\beta$ of the discharge current, where $\beta$ is the current gain of the power transistor Tpw) and therefore it may be a transistor of relatively small size. An advantage of this circuit in respect to the known circuits is that of allowing recirculation of the discharge current from the inductive load through the power transistor Tpw at a voltage equal essentially to the supply voltage plus an overvoltage which, independently of the actual value of the supply voltage, is limited to the value of one VBE without requiring the use of a recirculation power device.

As will be apparent to the skilled technician, recirculation of the discharge current of the inductance may also be conducted at incrementally increased voltages (increased by a multiple number (n) of VBE), if so desired by inserting (n) diodes or (n) Zener diodes in series between the collector of the power transistor Tpw and the emitter of the control transistor of opposite polarity Tc.

Notwithstanding the undiscussed advantages in respect to the prior art circuits, the circuit of the invention, as depicted in FIG. 1 and in FIG. 2, remains unable to limit the maximum absolute value of the total voltage at which recirculation through the power transistor Tpw of the discharge current from the inductive load takes place, should an anomalous increase of the supply voltage (e.g. caused by a dumping effect) be concomitant with the switching off of the current through the load. Under these accidental circumstances the power device Tpw may be subjected to an excessive voltage. When these circumstances are anticipated, the circuit of the invention may be modified in order to make the circuit capable of obviating also this additive problem, through the addition of a secondary recirculation means which is brought into conduction by the raising of the supply voltage above a pre-set value and determining, in all instances, the turning-on of the power transistor.

Figure 3:
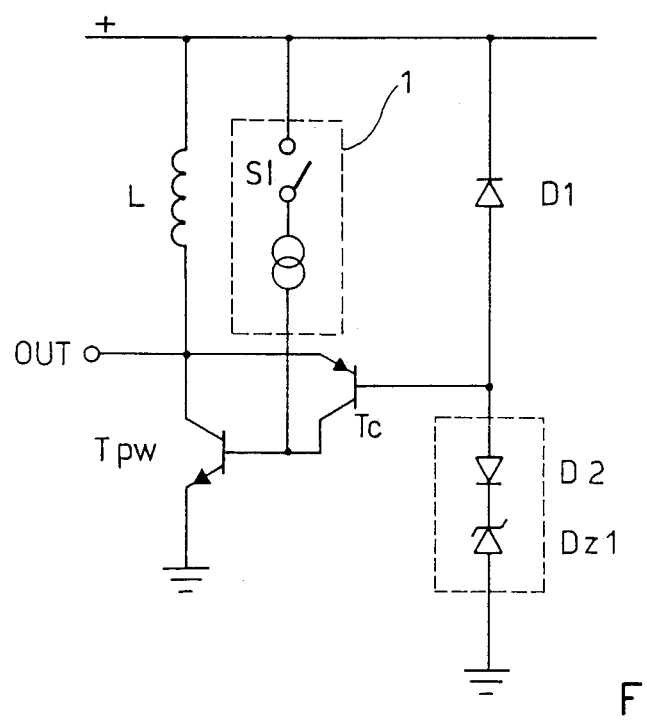
FIG. 3 is a circuit diagram of another embodiment of the circuit of the invention.

Such a modified embodiment of the circuit of the invention is shown in FIG. 3. The operation of the circuit may be described as follows. In the case of normal operating conditions, i.e. with a normal value of the supply voltage, when interrupting the driving of the power switching transistor Tpw (for example by opening the switch S1 of the drive circuit 1) a positive overvoltage across the inductance L develops. When this overvoltage reaches the value corresponding to $VAL + VBE_{Tc} + VBE_{D1}$ (where VAL is the supply voltage), the power device Tpw turns on again because of the turning-on of the PNP control transistor Tc which acts as a driver.

In case the circuit is occasionally subjected to positive overvoltages over the normal value of the supply voltage VAL, the circuit behaves as follows.

When driving of the power transistor Tpw is interrupted, if a concomitant positive overvoltage on the value of the supply voltage VAL is present, the additional recirculation means formed by the diode D2 and by the Zener diode DZ1 forces the control transistor Tc and consequently the power transistor Tpw to turn-on whenever the voltage of the output node $V_{OUT}$ reaches a value given by:

$$VBE_{Tc} + VBE_{D2} + V_{DZ1};$$

this taking place through the triggering of the Zener diode DZ1 and of the consequent turning-on of D2 and of Tc.

In this way the maximum recirculation voltage affecting the power transistor Tpw may be conveniently limited thus positively preventing the power device Tpw from being subjected to destructive voltages even in the presence of high overvoltages on the supply at the instant of interruption of the driving of the power switching transistor.

From the point of view of monolithic integration, the embodiment depicted in FIG. 3 offers the advantage of allowing relative lower voltage fabrication process because the circuit of the invention provides a reliable protection of the power transistor against breakdown.

As will be clear to the skilled technician, the improved circuit of FIG. 3 maintains the advantage of utilizing substantially a single power device for driving the inductive load as well as for recirculating the discharge current of the load. The secondary recirculation means, namely the diodes D1, D2 and DZ1, must, in fact, be capable of withstanding a fraction of the recirculation current which flows almost exclusively through the power transistor Tpw.

Of course, the circuit of FIG. 3 may be made with devices (transistors) of reverse polarity by inverting all the polarities of the circuit.

We claim:

1. A circuit for recirculating a discharge current of an inductive load through the same power switching driving transistor of a first polarity having an emitter connected to a first supply rail, a collector connected to one terminal of said inductive load, the second terminal of said inductive load being connected to a second supply rail, and a base to which a driving signal is applied, comprising:

a transistor of opposite polarity with respect to the polarity of said power switching transistor and having an emitter a collector and a base;

the emitter of said transistor of opposite polarity being connected to the collector of said power transistor;

the collector of said transistor of opposite polarity being connected to the base of said power transistor;

a first diode having a cathode connected to the second supply rail operatively at a positive voltage with respect to the first supply rail;

a second diode having an anode connected to the anode of said first diode;

a Zener diode having a cathode connected to the cathode of said second diode and having an anode connected to the first supply rail;

the base of said transistor of opposite polarity being connected to the anodes, connected in common, respectively, of said first and of said second diode, said Zener diode and second diode establishing a threshold voltage on said transistor of opposite polarity, whereby said driving transistor is rendered conductive when said driving transistor's collector voltage exceeds said threshold voltage, and the voltage across said driving transistor is limited to a voltage established by said Zener diode, and second diode.

2. A circuit of claim 1 further comprising a drive circuit connected between the base of said power transistor and one of said supply rails.

* * * * *